United States Patent
Moon et al.

(10) Patent No.: US 9,799,407 B2
(45) Date of Patent: Oct. 24, 2017

(54) METHOD FOR OPERATING STORAGE DEVICE MANAGING WEAR LEVEL DEPENDING ON REUSE PERIOD

(71) Applicant: SAMSUNG ELECTRONICS CO., LTD., Suwon-si, Gyeonggi-Do (KR)

(72) Inventors: Sangkwon Moon, Osan-si (KR); Chul Lee, Hwaseong-si (KR); Hyun Jin Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/201,734

(22) Filed: Jul. 5, 2016

(65) Prior Publication Data
US 2017/0060446 A1   Mar. 2, 2017

(30) Foreign Application Priority Data
Sep. 2, 2015 (KR) .................. 10-2015-0124297

(51) Int. Cl.
*G11C 16/34* (2006.01)
*G06F 3/06* (2006.01)
*G11C 13/00* (2006.01)

(52) U.S. Cl.
CPC ............ *G11C 16/349* (2013.01); *G06F 3/064* (2013.01); *G06F 3/0616* (2013.01); *G06F 3/0652* (2013.01); *G06F 3/0679* (2013.01); *G11C 13/0035* (2013.01); *G11C 16/3495* (2013.01)

(58) Field of Classification Search
CPC .... G06F 3/0616; G06F 3/0679; G06F 3/0652; G06F 3/064; G11C 13/0035; G11C 16/349; G11C 16/3495
See application file for complete search history.

(56) References Cited

U.S. PATENT DOCUMENTS

| | | | |
|---|---|---|---|
| 6,654,287 B2 | 11/2003 | Visconti | |
| 7,441,067 B2 | 10/2008 | Gorobets et al. | |
| 7,467,253 B2 | 12/2008 | Yero | |
| 7,679,133 B2 | 3/2010 | Son et al. | |
| 7,715,234 B2 | 5/2010 | Aritome et al. | |
| 7,715,239 B2 | 5/2010 | Aritome | |
| 7,903,486 B2 | 3/2011 | Danilak | |
| 8,060,718 B2 | 11/2011 | Freitas et al. | |
| 8,130,553 B2 | 3/2012 | Buch et al. | |
| 8,254,172 B1 | 8/2012 | Kan | |
| 8,335,886 B2 | 12/2012 | Lee | |
| 8,341,335 B2 * | 12/2012 | Weingarten | G06F 12/0246 711/103 |
| 8,356,152 B2 | 1/2013 | You | |

(Continued)

FOREIGN PATENT DOCUMENTS

| | | |
|---|---|---|
| JP | 2010-515127 A | 5/2010 |
| KR | 10-1089967 B1 | 12/2011 |

(Continued)

*Primary Examiner* — Vanthu Nguyen
(74) *Attorney, Agent, or Firm* — Volentine & Whitt, PLLC

(57) ABSTRACT

A storage device includes a flash memory and a memory controller. The flash memory includes a plurality of memory blocks. The memory controller is configured to determine a fast cycle weight corresponding to a reuse period of a selected memory block among the plurality of memory blocks, and to manage wear leveling of the selected memory block using the fast cycle weight.

18 Claims, 17 Drawing Sheets

(56) References Cited

U.S. PATENT DOCUMENTS

| | | | |
|---|---|---|---|
| 8,433,843 B2 | 4/2013 | Paddon et al. | |
| 8,473,668 B2* | 6/2013 | Kim | G11C 11/5628 365/185.09 |
| 8,553,466 B2 | 10/2013 | Han et al. | |
| 8,559,235 B2 | 10/2013 | Yoon et al. | |
| 8,576,635 B2 | 11/2013 | Kim et al. | |
| 8,576,862 B2 | 11/2013 | Sonnier et al. | |
| 8,583,859 B2* | 11/2013 | Masuo | G06F 12/0246 711/103 |
| 8,650,461 B2 | 2/2014 | Shalvi et al. | |
| 8,654,587 B2 | 2/2014 | Yoon et al. | |
| 8,681,554 B2 | 3/2014 | Suzuki | |
| 8,873,293 B1 | 10/2014 | Ou et al. | |
| 9,009,568 B2 | 4/2015 | Luo et al. | |
| 9,015,537 B2 | 4/2015 | Griffin et al. | |
| 9,047,955 B2 | 6/2015 | Cometti et al. | |
| 9,070,449 B2 | 6/2015 | Yang et al. | |
| 9,176,862 B2 | 11/2015 | Chen et al. | |
| 9,286,990 B1* | 3/2016 | Lee | G11C 16/16 |
| 2003/0053334 A1 | 3/2003 | Chen | |
| 2010/0077266 A1* | 3/2010 | Kanno | G06F 11/1068 714/704 |
| 2010/0174845 A1 | 7/2010 | Gorobets et al. | |
| 2011/0233648 A1 | 9/2011 | Seol et al. | |
| 2011/0252289 A1 | 10/2011 | Patapoutian et al. | |
| 2011/0320688 A1 | 12/2011 | Lee | |
| 2012/0063231 A1 | 3/2012 | Wood et al. | |
| 2013/0145079 A1* | 6/2013 | Lee | G06F 12/0246 711/103 |
| 2013/0163338 A1 | 6/2013 | Kato | |
| 2013/0346812 A1 | 12/2013 | Bahirat et al. | |
| 2014/0192593 A1 | 7/2014 | Kim | |
| 2014/0269068 A1 | 9/2014 | D'Abreu et al. | |
| 2014/0372678 A1 | 12/2014 | Moon et al. | |
| 2015/0277795 A1* | 10/2015 | Choi | G06F 3/0619 711/103 |

FOREIGN PATENT DOCUMENTS

| | | |
|---|---|---|
| KR | 10-2013-0084901 A | 7/2013 |
| KR | 10-2014-0119701 A | 10/2014 |
| KR | 10-2014-0145063 A | 12/2014 |
| KR | 10-2014-0145254 A | 12/2014 |

* cited by examiner

FIG. 12

| Reuse Period (R/P) | Weight of fast cycle (WOF) |
|---|---|
| R/P ≤ 5s | 5 |
| 5s < R/P ≤ 10s | 3 |
| 10s < R/P ≤ 50s | 2 |
| 50s < R/P ≤ TCR | 1 |

FIG. 13

| R/P | 5s | 8s | 5s | 15s | 50s | SUM |
|---|---|---|---|---|---|---|
| NOE | 1 | 1 | 1 | 1 | 1 | 5 |
| WOF | 5 | 3 | 5 | 2 | 1 | 16 |

FIG. 14

| R/P | 5s | 8s | 5s | 15s | 50s | SUM |
|---|---|---|---|---|---|---|
| NOE | 1 | 1 | 1 | 1 | 1 | 5 |
| $WOF_m$ | 5 | 5 | 5 | 5 | 5 | 25 |

METHOD FOR OPERATING STORAGE DEVICE MANAGING WEAR LEVEL DEPENDING ON REUSE PERIOD

CROSS-REFERENCE TO RELATED APPLICATIONS

A claim of priority under 35 USC §119 is made to Korean Patent Application No. 10-2015-0124297, filed Sep. 2, 2015, the entirety of which is hereby incorporated by reference.

BACKGROUND

The present disclosure relates to semiconductor memories. More particularly, the present disclosure relates to storage devices in which a wear level thereof is managed, and to methods for managing the wear level of storage devices.

Nonvolatile memories retain stored data even in the absence of supplied power. Examples of nonvolatile memories include read-only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), and the like.

With advancements in semiconductor manufacturing technologies, nonvolatile and other memories have experienced higher and higher degrees of device integration, resulting in ever higher memory capacities per unit area and per unit cost. However, the resultant scaling down of the memories can create unforeseen operational problems over time which can degrade reliability. These and other problems can be mitigated, and the lifespan of a nonvolatile memory extended, by adopting wear leveling techniques in which erasures and rewrites are distributed evenly across a cell array or arrays of the nonvolatile memory.

SUMMARY

A method for operating a storage device including a flash memory according to example embodiments of the inventive concepts includes determining a reuse period of a selected memory block of the flash memory, determining a fast cycle weight according to the reuse period of the selected memory block, and managing wear leveling of the selected memory block using the fast cycle weight.

A storage device according to example embodiments of the inventive concepts includes a flash memory and a memory controller. The flash memory includes a plurality of memory blocks. The memory controller is configured to determine a fast cycle weight corresponding to a reuse period of a selected memory block among the plurality of memory blocks, and to manage wear leveling of the selected memory block using the fast cycle weight.

A user device according to example embodiments of the inventive concepts includes host and a storage device. The storage device is configured to determine a fast cycle weight corresponding to a reuse period of a selected memory block in a flash memory, and manage wear leveling of the selected memory block using the fast cycle weight. The host is connected to the storage device through a host interface.

A memory controller according to example embodiments of the inventive concepts is for controlling a memory including a plurality of memory blocks. The memory controller includes a memory interface and a processor. The interface is configured to interface with the memory. The processor is configured to control successive erase/program operations of a selected memory block of the memory via the memory interface. The processor is further configured to determine a reuse period of each successive erase/program operation, and to manage wear leveling of the selected memory block according to a fast cycle weight of each successive erase/program operation. The processor is further configured to weight of a value of each fast cycle weight inversely relative to a duration of each corresponding reuse period.

BRIEF DESCRIPTION OF THE DRAWINGS

The forgoing and other features of the inventive concepts will be described below in more detail with reference to the accompanying drawings of non-limiting embodiments of the inventive concepts in which like reference characters refer to like parts throughout the different views. The drawings are not necessarily to scale, emphasis instead being placed upon illustrating principles of the inventive concepts. In the drawings:

FIGS. 12, 13, and 14 are tables for reference in describing the flowchart of FIG. 11;

DETAILED DESCRIPTION

Figure 1:
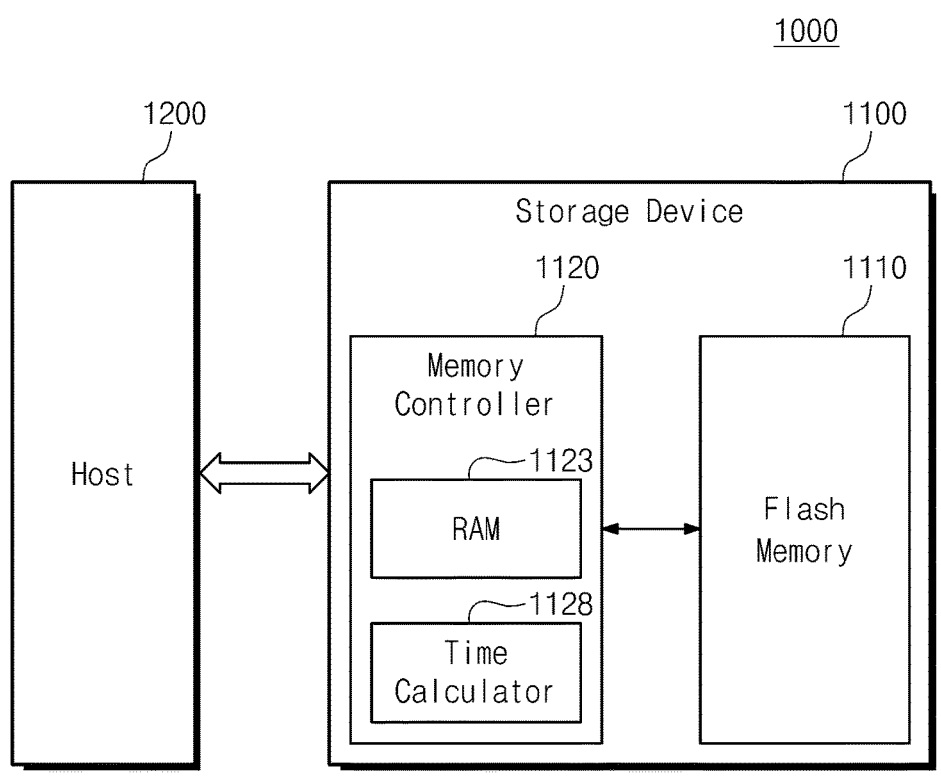
FIG. 1 is a block diagram of a user device according to example embodiments of the inventive concepts.

Example embodiments will now be described more fully with reference to the accompanying drawings, in which some example embodiments are shown. Example embodiments may, however, be embodied in many different forms and should not be construed as being limited to the embodiments set forth herein; rather, these example embodiments are provided so that this disclosure will be thorough and complete, and will fully convey the scope of example embodiments of the inventive concepts to those of ordinary skill in the art. In the drawings, the thicknesses of layers and regions are exaggerated for clarity. Like reference characters and/or numerals in the drawings denote like elements, and thus their description may be omitted.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

FIG. 1 is a block diagram of a user device 1000 according to example embodiments of the inventive concepts. As illustrated, the user device 1000 includes a storage device 1100 and a host 1200. In order to be utilized, the storage device 1100 may be electrically connected to the host 1200 via a wired and/or wireless connection.

Examples of the storage device 1100 include solid state drives (SSD) and memory cards. Examples of memory cards include personal computer memory card international association (PCMCIA) cards, compact flash card (CF), smart media cards (SM and SMC), memory sticks, multimedia cards (MMC, RS-MMC, and MMCmicro), secure digital (SD) cards (SD, miniSD, microSD, and SDHC), universal serial bus (USB) memory cards, and universal flash storage (UFS). Also, the storage device 1100 may include an embedded memory. Examples of embedded memory include embedded multimedia cards (eMMC), UFS, and perfect page new (PPN) memory.

The memory controller 1120 of the storage device 1100 includes a random access memory (RAM) 1123 and a time calculator 1128. In FIG. 1, the RAM 1123 is illustrated as being part of the memory controller 1120. However, the inventive concepts are not limited in this fashion, and the RAM 1123 may instead be located external the memory controller 1120.

The memory controller 1120 controls an overall operation of the flash memory 1110 in response to requests or commands issued by the host 1200. For example, in a write operation, the memory controller 1120 may receive a write command and data from the host 1200, and store the received data in the RAM 1123. The memory controller 1120 may then write the data stored in the RAM 1123 into the flash memory 1110.

The RAM 1123 may be used as a buffer memory, a cache memory and/or a working memory. The RAM 1123 may be implemented using any one or more of a variety of RAM memory technologies. Examples of such RAM memory technologies include dynamic RAM (DRAM), static RAM (SRAM), synchronous DRAM (SDRAM), phase-change RAM (PRAM), magnetic RAM (MRAM), resistive RAM (RRAM), and ferroelectric RAM (FeRAM).

The time calculator 1128 of the memory controller 1120 may operate based on a local time and/or global time of the storage device 1100, which may be determined using an internal clock or a clock supplied from the host 1200. Here, the local time relates to a time elapsed in the storage device 1100 from a reference point in time, i.e., a time local to the storage device 1100. For example, the local time may correspond to the time elapsed from a time when the storage device 1100 is supplied with power. On the other hand, global time refers to an actual or real time in which the user device 1000 including the storage device 1100 operates. For example, the global time may be determined by synchronizing the time of the storage device 1100 with the time of the host 1200.

The time calculator 128 functions to calculate a reuse period of the flash memory 1100 based on, for example, either the global time or the local time. The reuse period corresponds, for example, to a time interval between a previous erase operation and a current erase operation of the flash memory 1110, or a time interval between a previous program operation and a current program operation.

Figure 2:
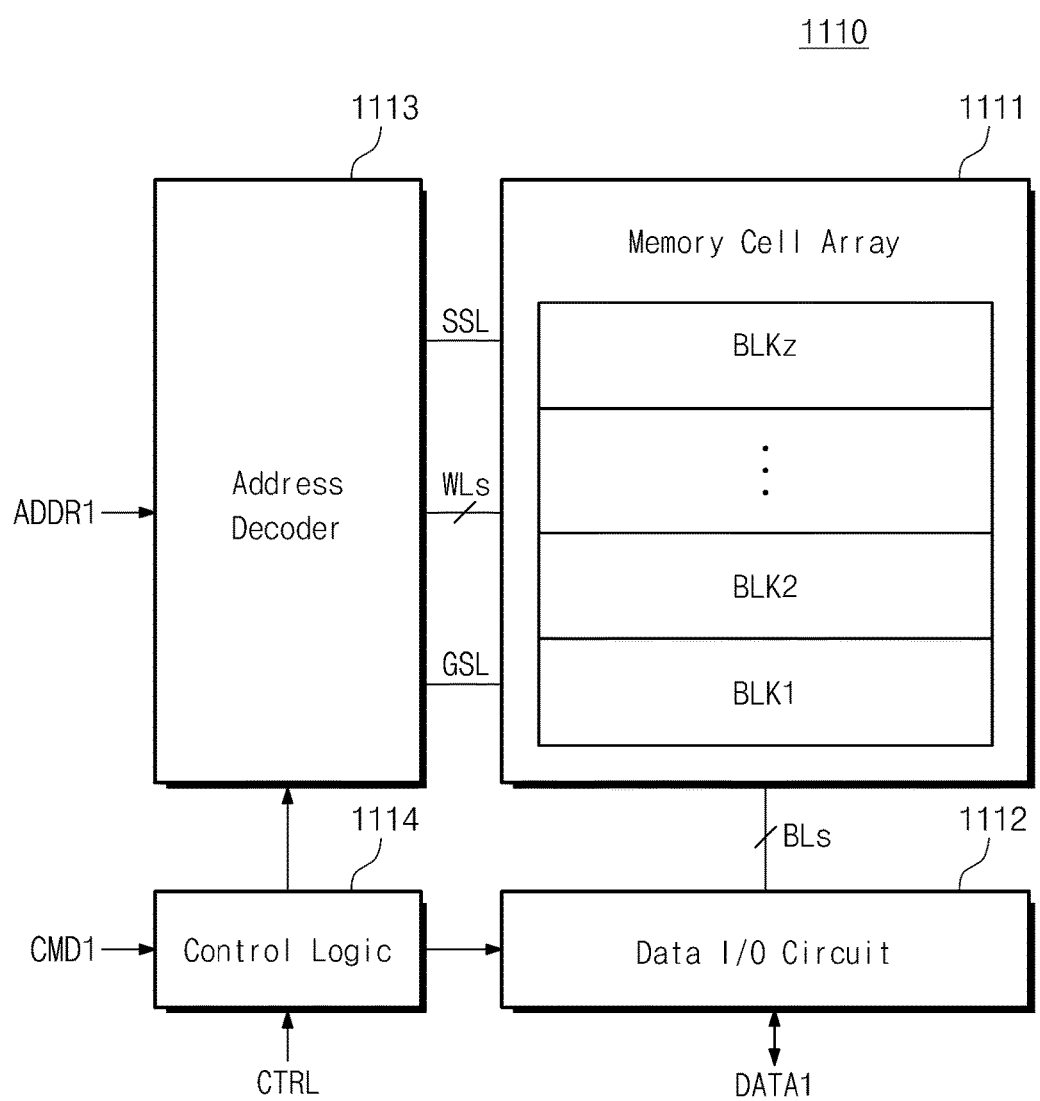
FIG. 2 is a block diagram of an example of a flash memory in FIG. 1.

FIG. 2 is a block diagram of an example of the flash memory 1110 in FIG. 1. As illustrated, the flash memory 1110 may include a memory cell array 1111, a data input/output (I/O) circuit 1112, an address decoder 1113, and a control logic 1114.

The memory cell array 1111 may include a plurality of memory blocks BLK1 to BLKz each having a plurality of memory cells. The memory blocks BLK1 to BLKz may have a two-dimensional structure in which memory cells are arrayed in a plane parallel to a substrate surface, or a three-dimensional structure in which memory cells are array in three dimensions so as to be stacked over a substrate surface. The memory blocks BLK1 to BLKz may each correspond to an erase unit of the memory cell array. In other words, an erase operation may be carried out in the unit of a memory block such that all the memory cells of the memory block are erased at the same time.

The data I/O circuit 1112 is connected to the memory cell array 1111 through a plurality of bitlines BLs. Generally, the data I/O circuit 1112 operates under control of the control logic 1114 to receive data DATA1 from an external device to be written to the memory cell array 1111, and to output data DATA1 read from the memory cell array DATA1 to an external device.

The address decoder 1113 is connected to the memory cell array 1111 through a plurality of wordlines WLs and selection lines GSL and SSL. Generally, the address decoder 1113 operates under control of the control logic 1114 and in accordance with an address ADDR1 to apply various operational voltages to the wordlines WLs and selection lines GSL and SSL. Examples of the operational voltages include program voltages, read voltages, pass voltages, and so on. The address ADDR1 is received from the memory controller 1120 (FIG. 1).

The control logic 1114 is responsive to command CMD1 and control CTRL signals received from the memory controller 1120 (FIG. 1) to execute operations such as program, read, and erase operations of the flash memory 1110. For example, during a program operation, the control logic 1114 may control the address decoder 1113 to provide a program voltage to a selected wordline among the wordlines WLs, and the data I/O circuit 1112 to program data to memory cells of the memory array 1111 connected to the selected wordline.

Figure 3:
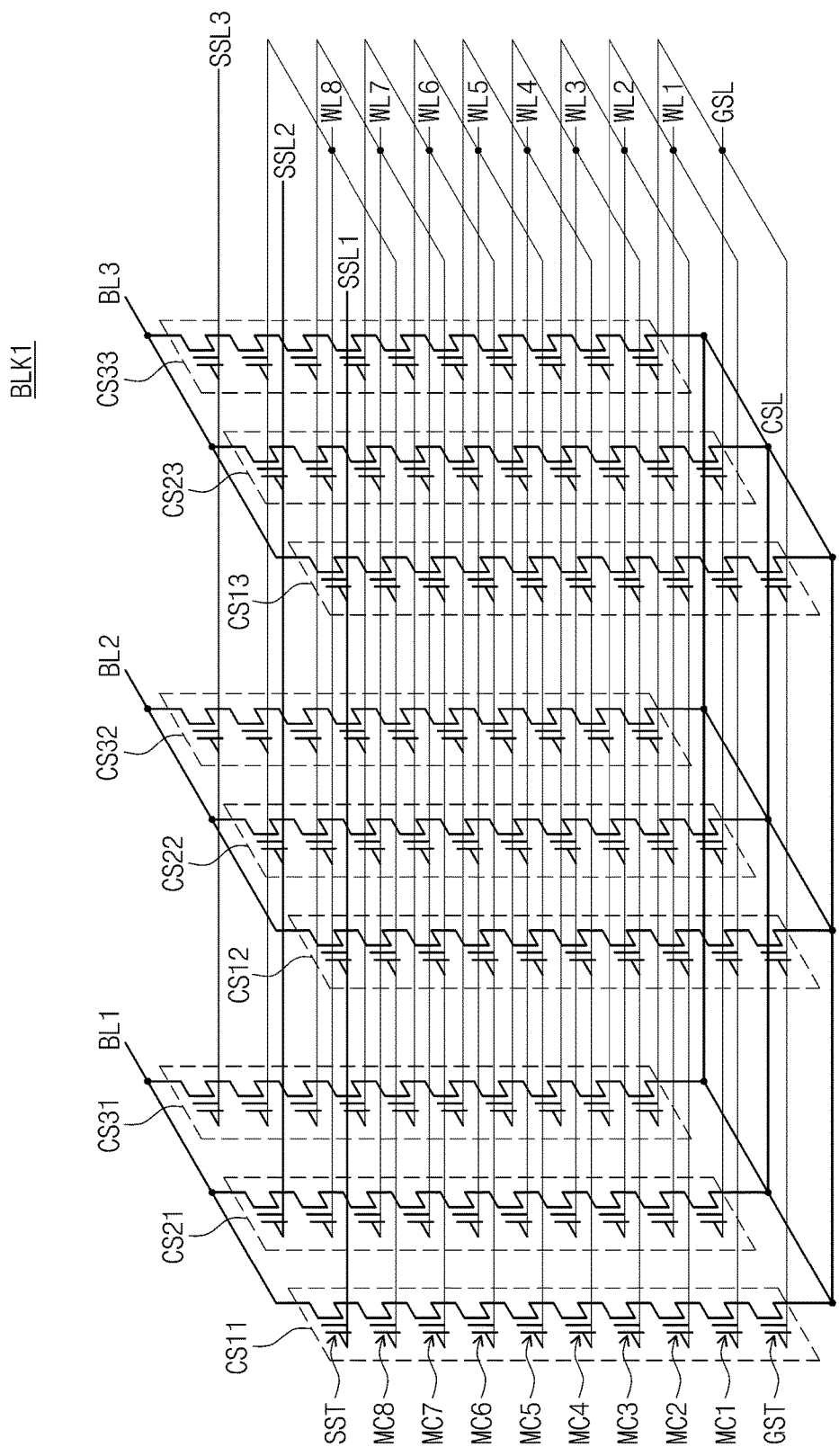
FIG. 3 is a circuit diagram of an example of a memory block in FIG. 2.

FIG. 3 is a circuit diagram of an example of a memory block BLK1 in FIG. 2. The memory block BLK1 of this example has a three-dimensional structure in which the memory cells of cell strings are stacked in a direction perpendicular to a substrate.

Referring to FIG. 3, cell strings CS11 to CS33 are coupled between a common source line CSL and one of bitlines BL1 to BL3. As shown at cell string CS11, each of the cell strings CS11 to CS33 includes a series connection of a ground selection transistor GST, a plurality of memory cells MC1 to MC8, and a string selection transistor SST.

The string selection transistor SST of each cell string is connected between one of the bitlines BL1 to BL3 and the memory cells MC1 to MC8, and is gated to one of first to third string selection lines SSL1 to SSL3. The ground selection transistor GST of each cell string is connected between the common source line CSL and the memory cells MC1 to MC8, and is gated to a ground selection line GSL. The ground selection line GSL may be configured of plural ground selection lines that are connected to each other.

The memory cells MC1 to MC8 are connected to corresponding wordlines WL1 to WL8, respectively. A group of simultaneously programmed memory cells is called a page (or a physical page). Generally, a memory block BLK1 may include a plurality of pages, where each of the pages is composed of memory cells connected to a same wordline, in which the cell strings thereof are connected to a same string selection line. For example, in FIG. 3, a wordline (e.g., WL4) connected to memory cells (e.g., MC4) at the same height from the common source line CSL is commonly connected to three pages. In the case of multilevel cells (MLC) storing more than one bit per cell, each bit position of the memory cells of a physical page may be considered a logical page.

Figure 4:
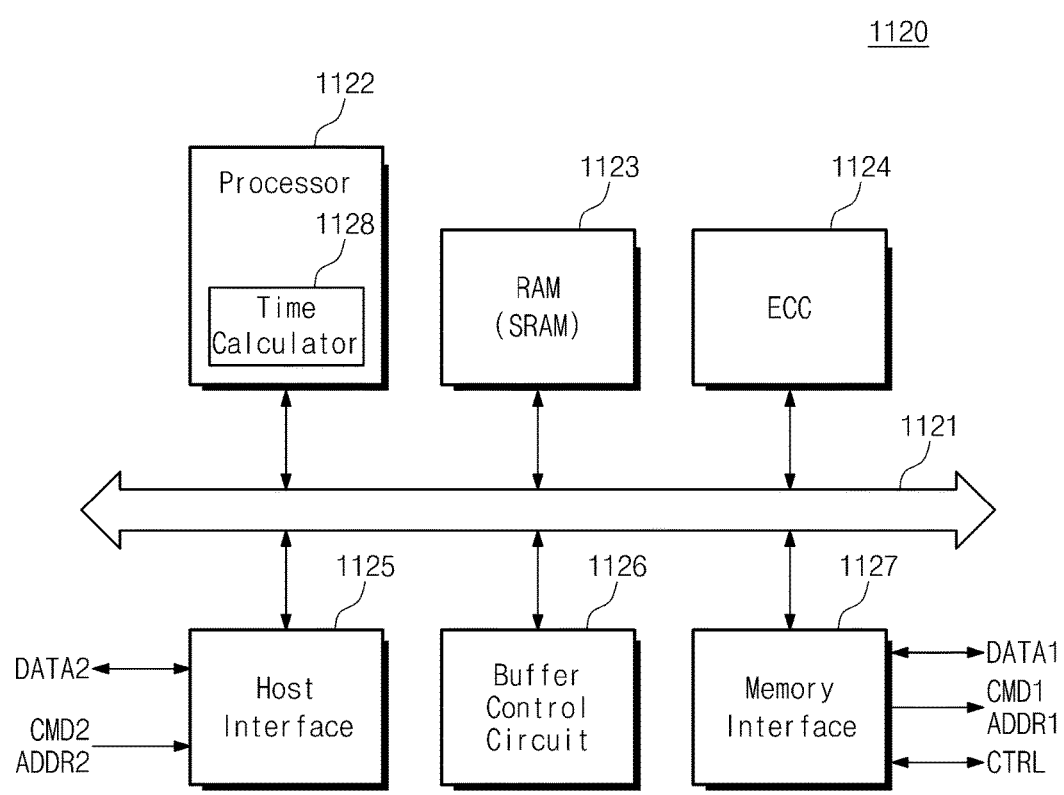
FIG. 4 is a block diagram of an example of a memory controller in FIG. 1.

FIG. 4 is a block diagram of an example of the memory controller 1120 in FIG. 1. As illustrated, the memory controller 1120 of this example includes a bus 1121, a processor 1122, a random access memory (RAM) 1123, an error correction coding (ECC) circuit 1124, a host interface 1125, a buffer control circuit 1126, and a memory interface 1127.

The bus 1121 provides communication channels between components of the memory controller 1120. The bus 1221 may be functionally segregated into a control bus and a data bus. In that case, the data bus may transmit data in the memory controller 1120, and the control bus may transmit control information such as a commands and addresses in the memory controller 1120.

The processor 1122 controls an overall operation of the memory controller 1120 and performs logical operations, and communicates with the host 1200 through the host interface 1125. In FIG. 4, the processor 1122 is illustrated as including a time calculator 1128. The time calculator 1128 may be software driven by the processor 1122, or hardware that is a part of a circuit of the processor 1122, or a combination of hardware and software.

The processor 1122 may control the memory controller 1120 according to coding loaded from a nonvolatile memory (e.g., read only memory, not shown) in the memory controller 1120 or from the flash memory 1110 (see FIG. 1).

The RAM 1123 may be used as a working memory, a cache memory or a buffer memory of the processor 1122. The RAM 1123 may store codes and commands that the processor 1122 executes or may store data processed by the processor 1122. The RAM 1123 may include static RAM (SRAM).

The ECC circuit 1124 may generate a error correction code (e.g., parity) for error correction based on first data DATA1 to be output to the memory interface 1127 or second data DATA2 received from the host interface 1125. The first data DATA1 and the parity may be provided to the flash memory 1110 through the memory interface 1127. The ECC circuit 1124 may correct an error of the received data DATA1 using the first data DATA1 and the parity received through the memory interface 1127. The ECC circuit 1124 may be included in the memory interface 1127.

The host interface 1125 is configured to communicate with the host 1200 according to the control of the processor 1122. The host interface 1125 may receive a second command CMD2 and a second address ADDR2 from the host 1200 and exchange second data DATA2 with the host 1200.

The host interface 1125 may be configured according to any of a variety of different communication protocols such as USB (Universal Serial Bus), SATA (Serial AT Attachment), SAS (Serial Attached SCSI), HSIC (High Speed Interchip), SCSI (Small Computer System Interface), Firewire, PCI (Peripheral Component Interconnection), PCIe (PCI express), NVMe (NonVolatile Memory express), UFS (Universal Flash Storage), SD (Secure Digital), MMC (MultiMedia Card), and eMMC (embedded MMC).

The buffer control circuit 1126 is configured to control the RAM 1123 according to the control of the processor 1122. The buffer control circuit 1126 may write data into the RAM 1123 and read data from the RAM 1123. When the RAM 1123 is an external RAM disposed outside the memory controller 1120, the buffer control circuit 1126 may control the external RAM 1123.

The memory interface 1127 is configured to communicate with the flash memory 1110 according to the control of the processor 1122. The memory interface 1127 may transmit a first command CMD1 and a first address ADDR1 to the flash memory 1110 and exchange the first data DATA1 and a control signal CTRL with the flash memory 1110.

Figure 5:
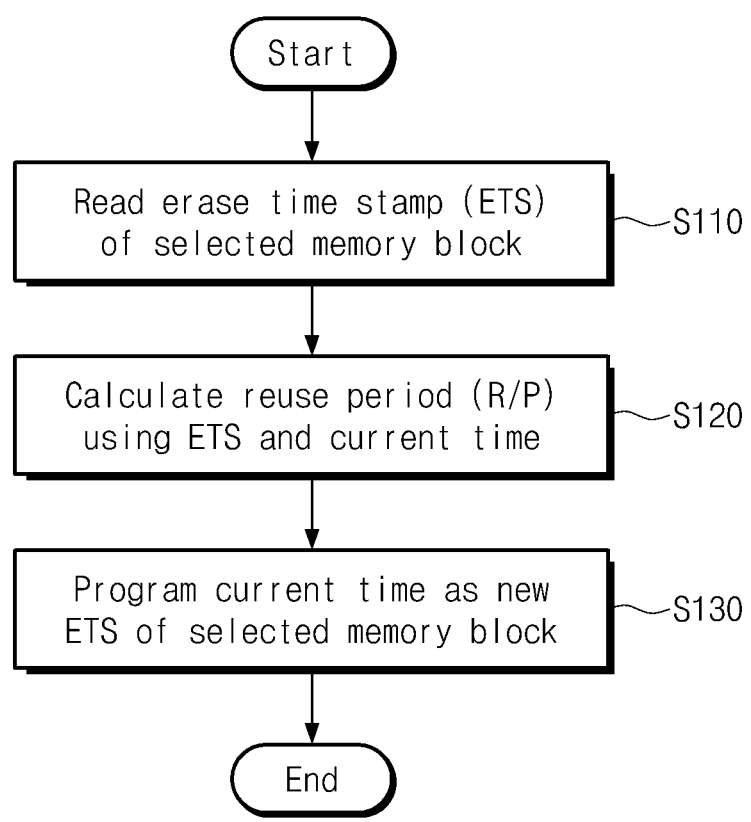
FIG. 5 is a flowchart summarizing an operation of a time calculator in FIG. 4.

FIG. 5 is a flowchart summarizing an operation of the time calculator 1128 of the processor 1122 in FIG. 4. The time calculator 1128 of this example calculates a reuse period of a selected memory block of the flash memory 1110 when the selected memory block is erased.

At S110, the memory controller 1120 reads an erase time stamp ETS of a selected memory block. The erase time stamp ETS denotes a time at which a previous erase of the selected memory block took place. The erase time stamp ETS may be read, for example, from spare memory cells of the selected memory block or from meta memory cells of a meta memory block, and then loaded in the RAM 1123.

At S120, the time calculator 1128 calculates a reuse period using the erase time stamp ETS and a current time. The reuse period of the example of FIG. 5 denotes a time interval between the current erase time and the previous erase time indicated by the erase time stamp ETS.

At S130, the time calculator 1128 may recognize the current time as a new erase time stamp ETS of the selected memory block and provide the current time to the memory controller 1120. The memory controller 1120 may load the current time, as a new erase time stamp ETS of the selected memory block, in the RAM 1123, and the store the new erase time stamp ETS in the spare memory cells of the selected memory block, or in the meta memory cells of the meta memory block.

When memory cells of the memory block BLK1 in FIG. 3 are programmed, charges may be trapped to insulating layers of the memory cells or insulating layers around the memory cells. When a predetermined time passes after the memory cells are erased and programmed, the charges trapped to insulating layers may return to the original state.

However, when the memory cells are re-erased and re-programmed within a predetermined time after they are programmed, the trapped charges may not return to the original state and may be accumulated at the insulating layers. When the trapped charges are accumulated, the memory cells may be degraded. The degradation of the memory cells may cause data reliability of the storage device 100 to be degraded and may cause the life of the storage device 1100 to be reduced.

The storage device 1100 in FIG. 1 may manage the number of fast cycles of a selected memory block using a reuse period to reduce degradation of memory cells. In addition, the storage device 1100 may reduce the degradation of the memory cells to improve the data reliability of the storage device 1100 and increase the lifetime of the storage device 1100.

Hereinafter, time taken from erasing (E) and programming (P) a selected memory block to re-erasing (E) and re-programming (P) the memory block will be referred to as "a reuse period". The reuse period may be defined as time elapsed from erasing a memory block to re-erasing the memory block (as in FIG. 5) or a time elapsed from programming a memory block to re-programming the memory block.

Figure 6:
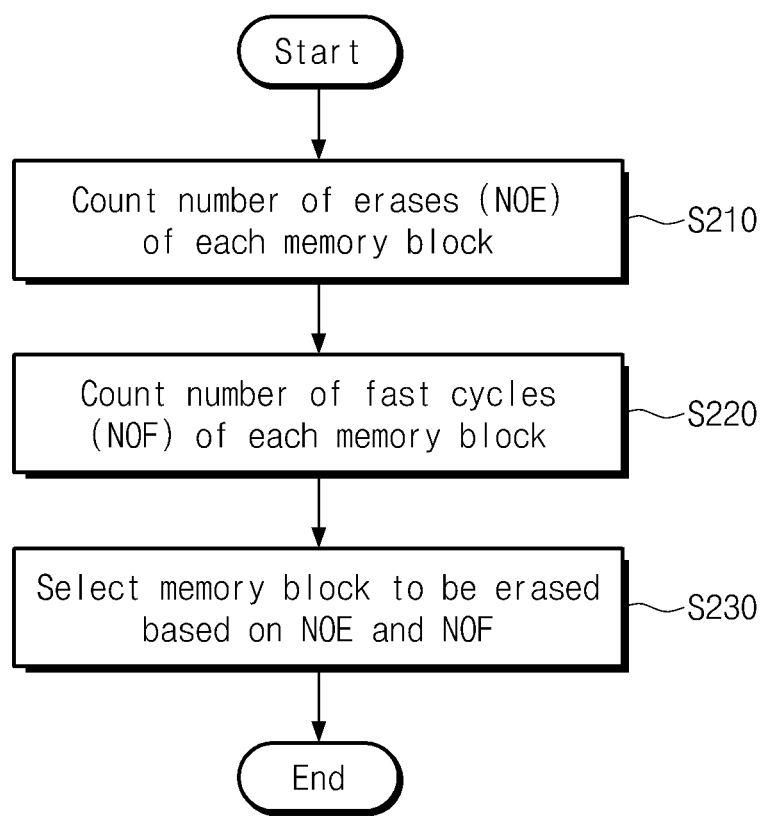
FIG. 6 is a flowchart summarizing an operation in which the user device in FIG. 1 selects a memory block to be erased.

FIG. 6 is a flowchart summarizing an operation in which the user device of FIG. 1 selects a memory block to be erased. Referring to FIG. 6, at 5210, the memory controller 1120 determines or counts the number of erases (NOE) of each memory block of the flash memory 1110. Also, at 5220, the memory controller 1120 determines or counts the number of fast cycles (NOF) of each memory block of the flash memory 1110. Then, at 5230, the memory controller 1120 selects a memory block to be erased, based on the NOE and the NOF of each memory block of the memory controller 1120.

A fast cycle is deemed to have occurred when a memory block is re-erased and re-programmed within a critical time period (or reference time period) after being erased and programmed. That is, the fast cycle may be deemed to have occurred when a reuse period of a selected memory block is shorter than the critical time period. The NOF refers to the total number of fast cycles during a plurality of successively performed erase operations and/or program operations on a selected memory block. Here, the term "successively" means spaced apart in time, with or without intervening execution of other operations on the selected memory block or other memory blocks.

Figure 7:
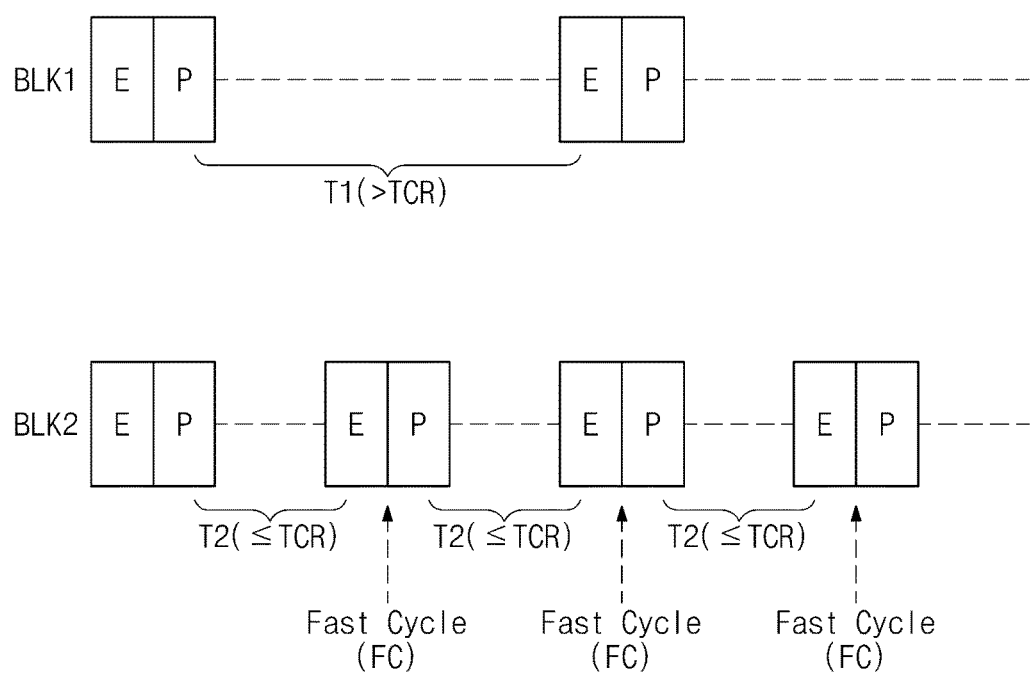
FIG. 7 is a conceptual diagram illustrating a number of erases (NOE) and a number of fast cycles (NOF) of a memory block described in FIG. 6.

FIG. 7 is a conceptual diagram illustrating the number of erases (NOE) and the number of fast cycles (NOF) of the memory block BLK1 described in FIG. 6. In FIG. 7, an erase operation (E) and a program operation (P) are performed in succession with the passage of time.

Referring first to BLK1 of FIG. 7, after first time period T1 has elapsed from performance of an erase operation (E) and a program operation (P) on the first memory block BLK1, another erase operation (E) and program operation (P) are performed. The first time period T1 is a reuse period of the first memory block BLK1. The reuse period of the first memory block BLK1 is longer than a critical time TCR which is used as a reference define a fast cycle. That is, after the first time period T1 longer than the critical time TCR has passed since the erase operation (E) and the program operation (P) are performed on the first memory block BLK1, the erase operation (E) is performed again. Thus, a fast cycle is deemed not to have occurred in the first memory block BLK1.

On the other hand, referring to BLK2 of FIG. 7, an erase operation (E) and a program operation (P) are successively performed on a second memory block BLK2 at reuse period of a second time period T2 that is shorter than or equal to the critical time TCR. Thus, each time the erase operation (E) and the program operation (P) are performed at the reuse period of the second time period T2, a fast cycle is deemed to have occurred in the second memory block BLK2. The number of erases (NOE) increases with each previous erase operation, and the number of fast cycles (NOF) increases with the occurrence of each fast cycle. In the example of FIG. 7, the NOE of the first memory block BLK1 is 1 and the NOF thereof is 0. The NOE of the second memory block is 3 and the NOF thereof is 3.

Figure 8:
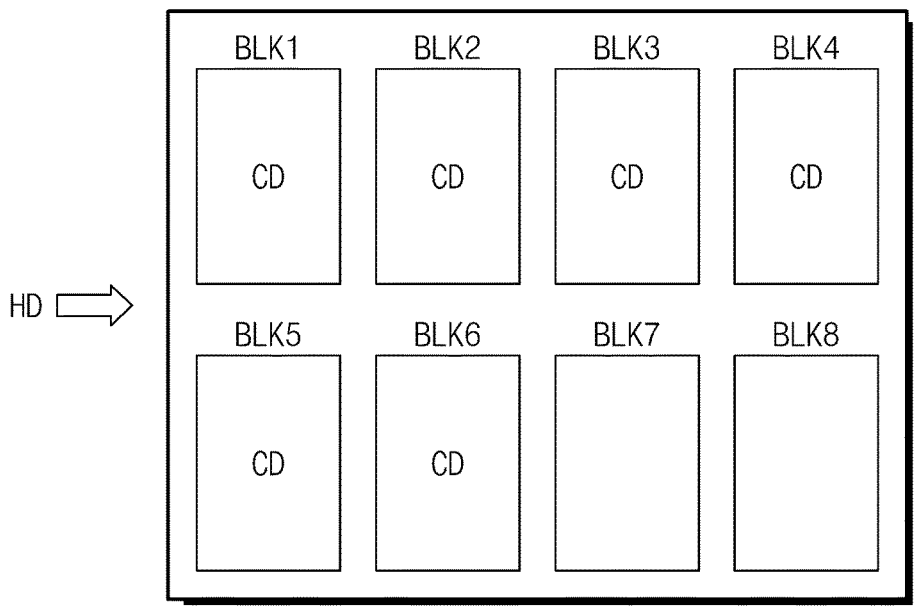
FIG. 8 is a block diagram illustrating an example of the occurrence of fast cycles (FC) in FIG. 7.

FIG. 8 is a block diagram for reference in further describing fast cycles (FC) in FIG. 7. In an upper portion in FIG. 8, first to eighth memory blocks BLK1 to BLK8 are shown. In a lower portion in FIG. 8, a table indicative of the relative number of erases (NOE) and the number of fast cycles (NOF) of the first to eighth memory blocks BLK1 to BLK8.

Cold data CD may be programmed into the first to sixth memory blocks BLK1 to BLK6. Cold data CD, in contrast to hot data HD, refers to data whose update frequency is relatively low. The cold data CD stored in the first to sixth memory blocks BLK1 to BLK6 may be retention data that are not frequently updated. That is, the NOE of the first to sixth memory blocks BLK1 to BLK6 is maintained without increase and the NOF thereof may be maintained at a state of zero.

The hot data HD may be programmed into seventh and eighth memory blocks BLK7 and BLK8 while the cold data CD is programmed into the first to sixth memory blocks BLK1 to BLK6. The hot data HD may be erased and programmed in the seventh and eighth memory blocks BLK7 and BLK8 in a relatively short reuse period. Thus, NOE and NOF may increase in the seventh and eighth memory blocks BLK7 and BLK8.

Figure 9:
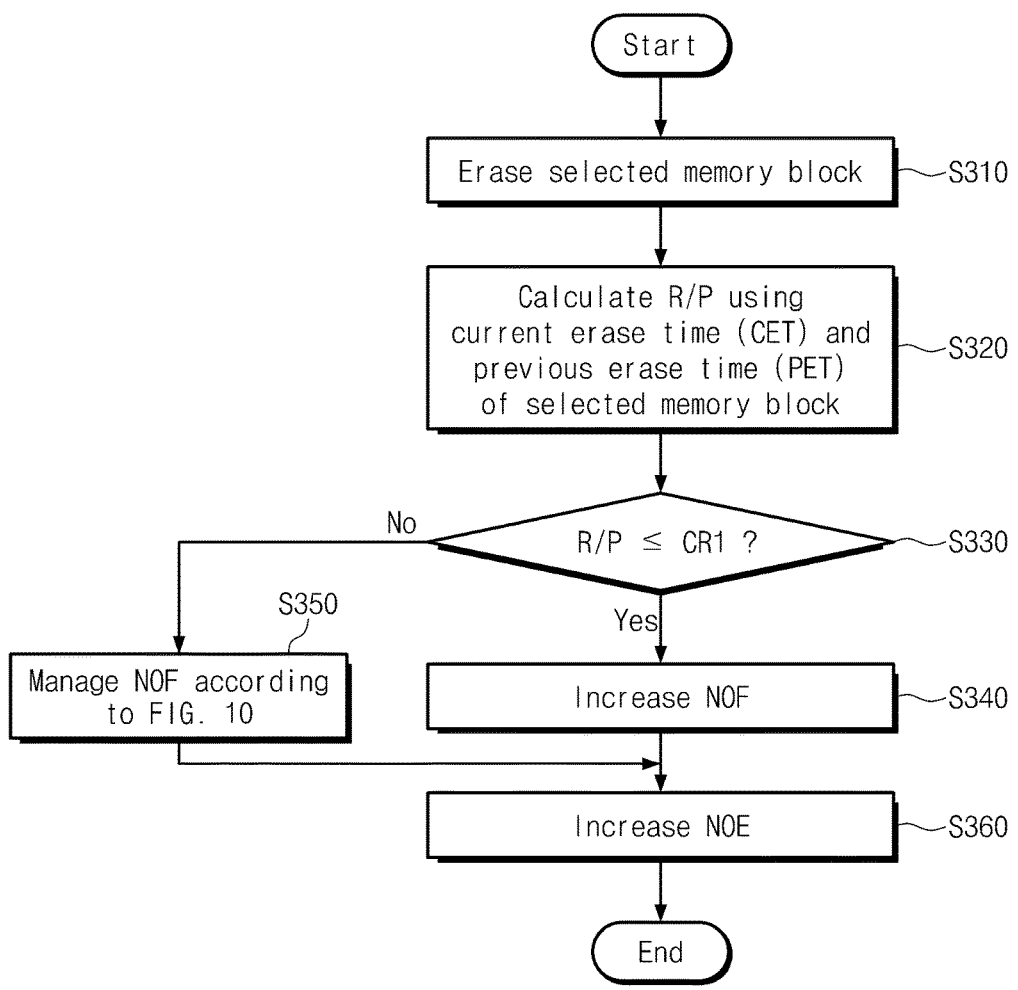
FIG. 9 is a flowchart summarizing a method for counting the number of fast cycles (NOF) in FIG. 7.

FIG. 9 is a flowchart summarizing a method for counting the number of fast cycles (NOF) in FIG. 7.

At S310, the memory controller 1120 erases a selected memory block.

At S320, the memory controller 1120 calculates a reuse period R/P using a current erase time and a previous erase time of a selected memory block. The reuse period R/P of the selected memory block may be calculated by the time calculator 1128 described previously.

At S330, the memory controller 1120 determines whether the calculated reuse period R/P is smaller than or equal to a first critical value CR1 (S330). The first critical value CR1 may be critical time TCR at which a fast cycle is deemed to have occurred. When the recycle period R/P is smaller than or equal to the first critical value CR1 (Yes), the flow proceeds to S340.

At 5340, the memory controller 1120 increases the NOF of the selected memory block.

Meanwhile, when the R/P of is greater than the first critical value CR1 (No), the flow proceeds to S350.

Figure 10:
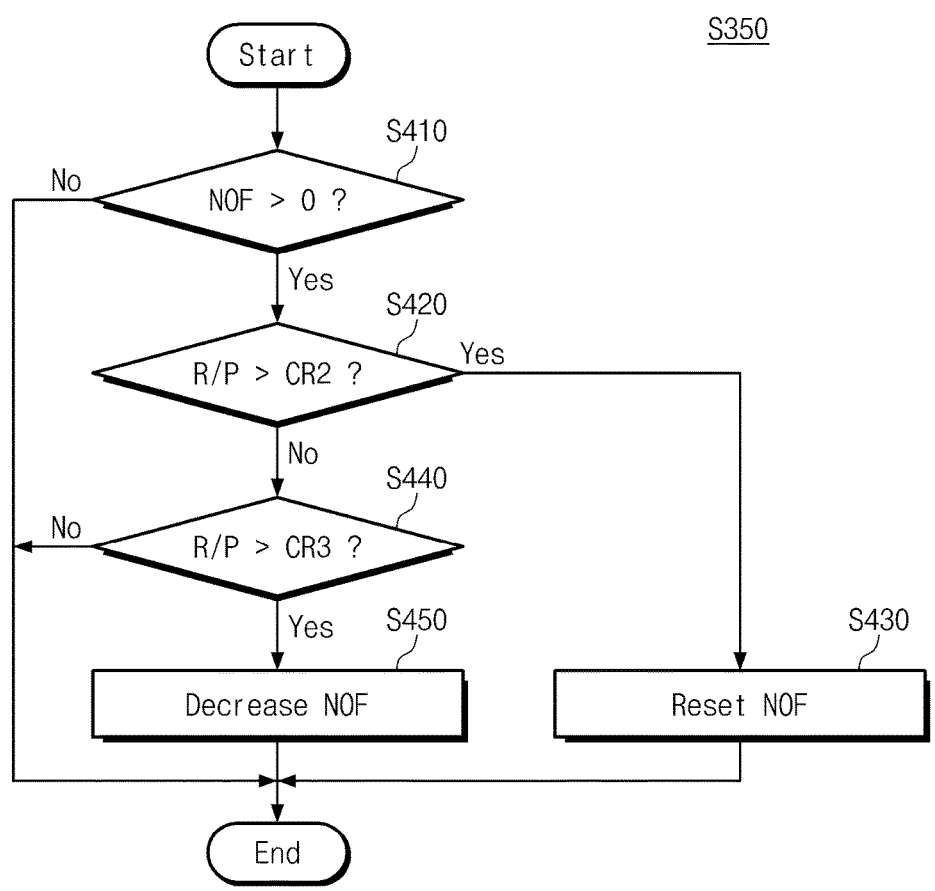
FIG. 10 is a flowchart summarizing S350 in FIG. 9.

At S350, the memory controller 1120 may manage the NOF of the selected memory block according to the method described in FIG. 10.

At S360, the memory controller 1120 increases the NOE of the selected memory block.

FIG. 10 is a flowchart summarizing S350 in FIG. 9. FIG. 10 illustrates a method for controlling the number of fast cycles (NOF) when a reuse period R/P between a current erase time and a previous erase time of a selected memory block is greater than the first critical value CR1 in FIG. 9.

At S410, the memory controller 1120 determines whether NOF of a selected memory block is greater than zero. When the NOF of the selected memory block is not greater than zero (No), the NOF of the selected memory block is not managed separately. When the NOF of the selected memory block is greater than zero, the flow proceeds to S420.

At S420, the memory controller 1120 determines whether a reuse period of the selected memory block is greater than a second critical value CR2. The second critical value CR2 may be much greater than the first critical value CR1 in FIG. 9 (CR2>>CR1). The second critical value CR2 may be sufficient time required to return charges trapped to insulating layers of memory cells MC or insulating layers around the memory cells MC to the original state. The second critical value CR2 may be a predetermined value or a value varying depending on the NOF of the selected memory block. At S420, when the reuse period R/P is greater than the second critical value CR2 (Yes), the flow proceeds to S430.

At S430, the memory controller 1120 resets the NOF of the selected memory block. That is, the NOF of the selected memory block is initialized to zero. Then the management of the NOF of the selected memory block is completed. At S420, when the reuse period R/P is not greater than the second critical value CR2 (No), the flow proceeds to S440.

At S440, the memory controller 1120 determines whether the reuse period R/P of the selected memory block is greater than a third critical value CR3. The third critical value CR3 may be greater than the first critical value CR1 and smaller than the second critical value CR2 (CR1<CR3<CR2). The third critical value CR3 may be time required to partially recover the charges trapped to the insulating layers of the memory cells MC or the insulating layers around the memory cells MC. At S440, when the reuse period R/P is greater than the third critical value CR3, the flow proceeds to S450.

At S450, the memory controller 1120 decreases the NOF. Then the management of the NOF of the selected memory block may be completed. At S440, even when the reuse period R/P is not greater than the third critical value CR3 (No), the management of the NOF of the selected memory block may also be completed.

When a reuse period is short, data reliability of the flash memory 1110 in FIG. 1 may be degraded. Therefore, the storage device 1100 including the flash memory 1110 manages a wear level such that a specific memory block is not reused frequently.

If the flash memory 1110 performs an erase operation on the same memory block predetermined times, the flash memory 1110 is not used any longer due to physical properties. Accordingly, the flash memory 1110 performs a wear leveling operation to prevent an erase operation from being repeatedly performed on a specific memory block.

The wear leveling may be performed through a flash translation layer (FTL). The FTL receives a logical address LA from a file system and translates the received logical address LA into a physical address PA. The FTL has an address mapping table for managing such an address mapping operation.

The wear leveling may be performed by changing address mapping of a logical block and a physical block. In example embodiments, the wear leveling may be performed as follows. When a write command is input from an external device, erase count information of all memory blocks are scanned sequentially or in a prescribed manner. When a memory block to store a data file reaches a greatest prescribed erase count, a physical address of a data block with a relatively small erase count is translated to store the data file in the memory block. The storage device 1100 may manage a wear level of each memory block in the above manner to uniformly reuse all the memory blocks.

Damage subjected to each memory block in the flash memory 1110 may be different according to a reuse period of each memory block. For example, a damage applied to a certain memory block may be different when the memory block is reused in a period of 10 seconds and a period of 30 seconds. If the number of reuses decreases when a memory block is reused in a period of 10 seconds and the number of reuses increases when the memory block is reused in a period 30 seconds, performance of the storage device 1100 may be enhanced while keeping data reliability.

FIGS. 11 to 14 are a flowchart and charts summarizing a method in which the storage device in FIG. 1 dynamically controls a wear level depending on a reuse period. Hereinafter, a method for operating the storage device 1100 in FIG. 11 will be described using the charts in FIGS. 12 to 14.

Figure 11:
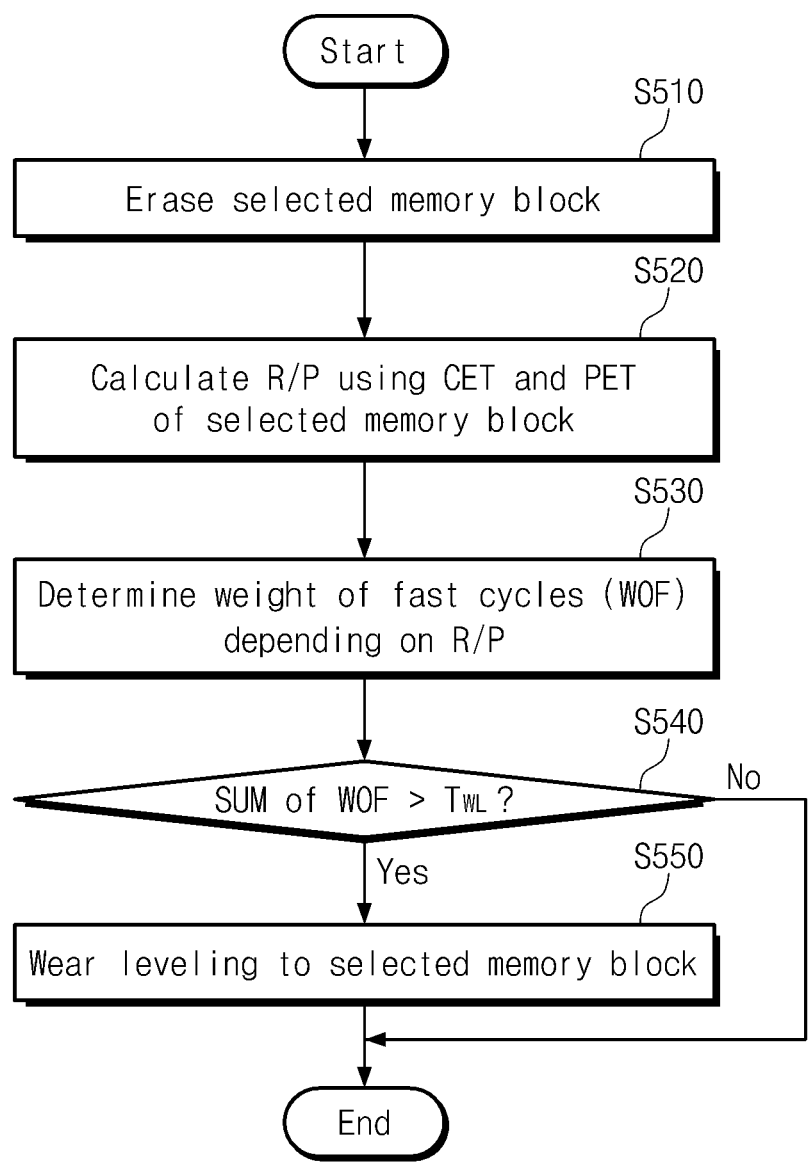
FIG. 11 is a flowchart summarizing a method in which the storage device in FIG. 1 dynamically controls a wear level depending on a reuse period.

Referring to FIG. 11, at S510, the memory controller 1120 erases a selected memory block. At S520, the memory controller 1120 calculates a reuse period (R/P) of the selected memory block using a current erase time (CET) and a previous erase time (PET) of the selected memory block. The reuse period (R/P) of the selected memory block may be calculated by the time calculator 1128 described previously.

At S530, the memory controller 1120 determines a weight of fast cycle (WOF) (also referred to herein as a "fast cycle weight") based on the reuse period (R/P). According to a reuse period (R/P) of each memory block, the memory controller 1120 may determine the extent to which a fast cycle value (e.g., a sum of fast cycle weights) is to be increased.

For example, as shown by the chart in FIG. 12, the memory controller 1120 may assign different fast cycle weights (WOFs) depending on the magnitude by which the reuse period (R/P) is less than the critical time period TCR. In the example of FIG. 12, a WOF of 5 is assigned in a case where the R/P is smaller than or equal to 5 seconds, a WOF of 3 is assigned in a case where the R/P is greater than 5 seconds and smaller than or equal to 10 seconds, a WOF of 2 is assigned in a case where the R/P is greater than 10 seconds and smaller than or equal to 50 seconds, and a WOF of 1 is assigned in a case where the R/P is smaller than or equal to critical time period TRC. In other words, the memory controller assigns a greater weighted value (i.e., a higher WOF) for reuse periods of shorter duration. To put it another way, the memory controller weights a value of each fast cycle weight inversely relative to a duration of each corresponding reuse period.

Returning to FIG. 11, at S540, the memory controller 1120 determines whether the sum of the WOF is greater than a wear leveling threshold (TWL). The sum of the WOF may be determined as shown in FIG. 13. Referring to FIG. 13, the R/P of the selected memory for successive program/erase operations is 5 seconds, 8 seconds, 5 seconds, 15 seconds, and 50 seconds, respectively. Since the number of erases (NOE) is 1, the sum of the NOE is 5. Applying the example of FIG. 12, the WOFs are 5, 3, 5, 2, and 1, respectively, the sum of the WOFs is 16.

Returning to FIG. 11, when the sum of the WOFs is greater than the TWL (Yes), the flow proceeds to S550.

At S550, when the sum of WOFs of the selected memory block reaches the TWL, the memory controller 1120 performs a wear leveling operation on the selected memory block. When the sum of WOFs of the selected memory block is not greater than the TWL (No) at S540, the wear leveling operation is not performed on the selected memory block.

In an alternative embodiment, when the WOF is determined and the sum of the WOFs is obtained at S530, the minimum of a reuse period may be applied to all periods. For example, referring to FIG. 14, since the minimum of the R/P of the selected memory block is 5 seconds, a fast cycle weight (WOFm) of all the periods may be 5. In this case, the sum of the WOFs may be calculated as 25.

As described above, the storage device 1100 according to example embodiments of the inventive concepts may dynamically manage a wear level depending on a reuse period. That is, a fast cycle is weighted depending on a reuse period of each memory block to dynamically manage a wear level. Thus, performance of the storage device 1100 may be enhanced while keeping data reliability. Particularly, in the case of a host spot test that repeatedly uses a constant area of the storage device 1100, a reuse period may vary depending on an area size of the hot spot test. According to example embodiments of the inventive concepts, performance degradation depending on a size of a hot spot test area may be suppressed.

Figure 15:
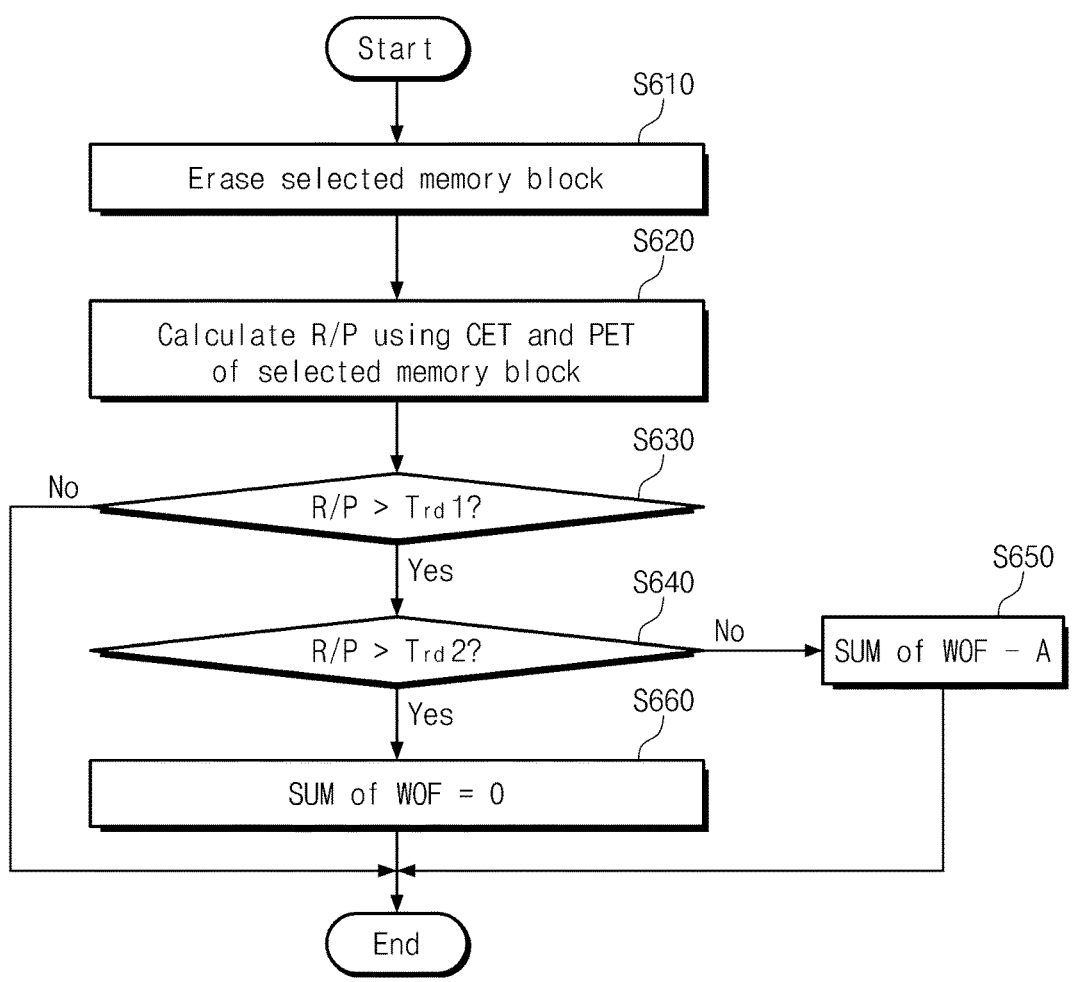
FIG. 15 is a flowchart summarizing a method for adjusting a sum of weights of fast cycle (WOF) depending on a reuse cycle of the storage device in FIG. 1.

FIG. 15 is a flowchart summarizing a method for adjusting the sum of weights of fast cycle (WOF) depending on a reuse cycle of the storage device 1100 in FIG. 1. If a reuse period of a selected memory block in the storage device 1100 is long enough to have a slight influence on data reliability, wear leveling may be effectively managed by decreasing the sum of the WOF.

At S610, the memory controller 1120 erases a selected memory block.

At S620, the memory controller 1120 calculates a reuse period (R/P) of the selected memory block using current erase time and previous erase time of the selected memory block.

At S630, the memory controller 1120 determines whether the reuse period (R/P) is greater than a first reduction threshold Trd1. The first reduction threshold Trd1 refers to a reuse period that nearly has no influence on data reliability of the selected memory block. When the reuse period (R/P) is not greater than the first reduction threshold Trd1 (No), an operation of decreasing the sum of the WOF is not performed. At S630, when the reuse period (R/P) is greater than the first reduction threshold Trd1, the flow proceeds to S640.

At 640, the memory controller 1120 determines whether the reuse period (R/P) is greater than second reduction threshold Trd2. The second reduction threshold Trd2 refers to a sufficiently long reuse period that has no influence on data reliability of the selected memory block. When the reuse period (R/P) is greater than the first reduction threshold Trd1 and is not greater than the second reduction threshold Trd2 (No), the flow proceeds to S650.

At S650, the memory controller 1120 performs an operation to decrease the sum of the WOF of the selected memory block by "A". The value "A" may be a predetermined fixed value or a value varying depending on a reuse period. When the reuse period (R/P) of the selected memory block is greater than the first reduction threshold Trd1, it has no influence on data reliability although the sum of the WOF decreases. At S640, when the reuse period (R/P) is greater than the second reduction threshold Trd2 (Yes), the flow proceeds to S660.

At S660, the memory controller 1120 resets the sum of the WOF of the selected memory block to zero. When the reuse period (R/P) of the selected memory block is greater than the second reduction threshold Trd2, it has no influence on data reliability although the memory controller 1120 resets the sum of the WOF of the selected memory block to zero.

The storage device 1100 may reduce performance degradation resulting from a user pattern. For example, it is assumed that a write operation is repeatedly performed on the same address (i.e., hot spot write). A reuse period of an area having a size of 1 GB may be about three to about five times shorter than that of an area having a size of 3 GB or 5 GB. According to example embodiments of the inventive concepts, since a slow program operation is dynamically performed depending on a reuse period, performance degradation may be efficiently reduced to fit a memory size.

A storage device according to example embodiments of the inventive concepts may be applied to various products. The storage device according to example embodiments of the inventive concepts may be implemented not only with electronic devices such as a personal computer, a digital computer, a camcorder, a handheld phone, an MP3 player, a PMP, a PSP, and a PDA, but also with a memory card, a USB memory, a solid state drive (SSD), and the like.

Figure 16:
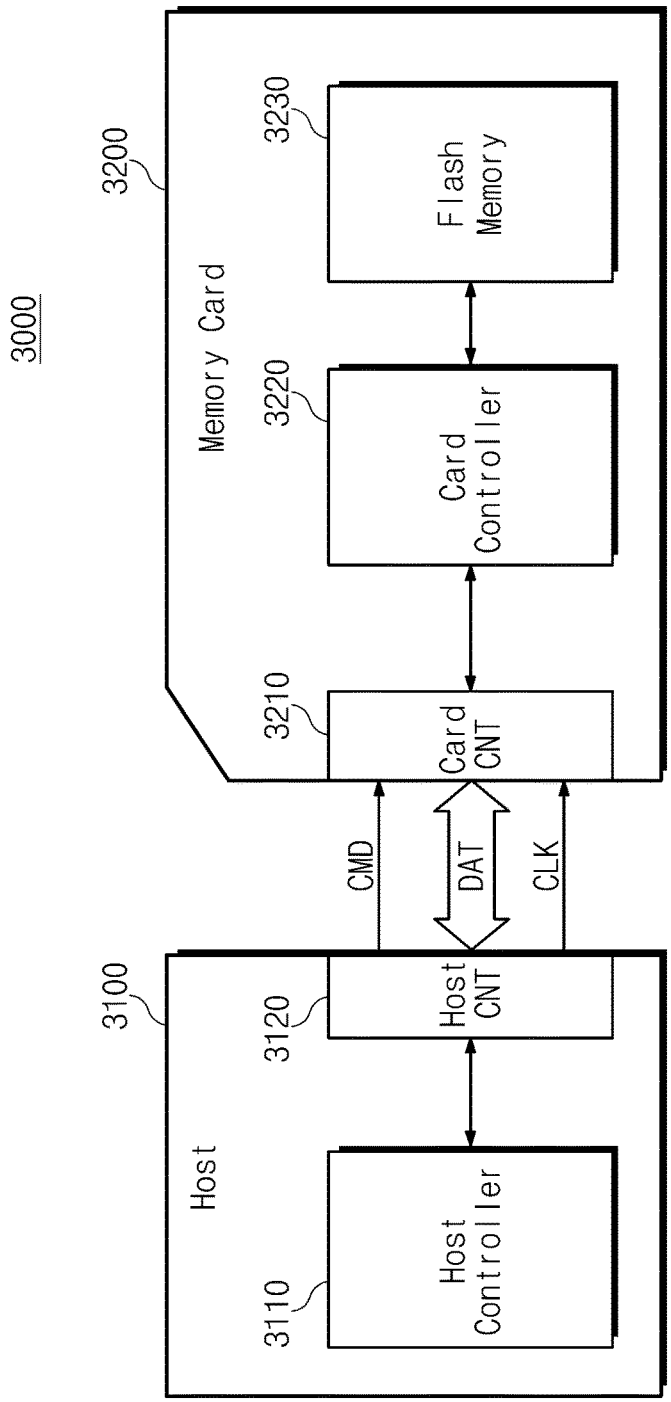
FIG. 16 is a block diagram illustrating an example in which one or more embodiments of the inventive concepts is applied to a memory card.

FIG. 16 illustrates an example of applying a storage device according to example embodiments of the inventive concepts to a memory card. As illustrated, a memory card system 3000 may include a host 3100 and a memory card 3200. The host 3100 may include a host controller 3110 and a host connection unit 3120. The memory card 3200 may include a card connection unit 3210, a card controller 3220, and a flash memory 3230.

The host 3100 may write data into the memory card 3200 or may read data stored in the memory card 3200. The host controller 3110 may transmit a command (e.g., write command), a clock signal CLK generated by a clock generator (not shown) in the host 3100, and data DATA to the memory card 3200 through the host connection unit 3120.

The card controller 3220 may store data in the flash memory 3230 in synchronization with a clock signal generated by a clock generator (not shown) in the card controller 3220 in response to a write command received through the card connection unit 3210. The flash memory 3230 may store data transmitted from the host 3100. For example, when the host 3100 is a digital camera, the flash memory 3230 may store image data.

Figure 17:
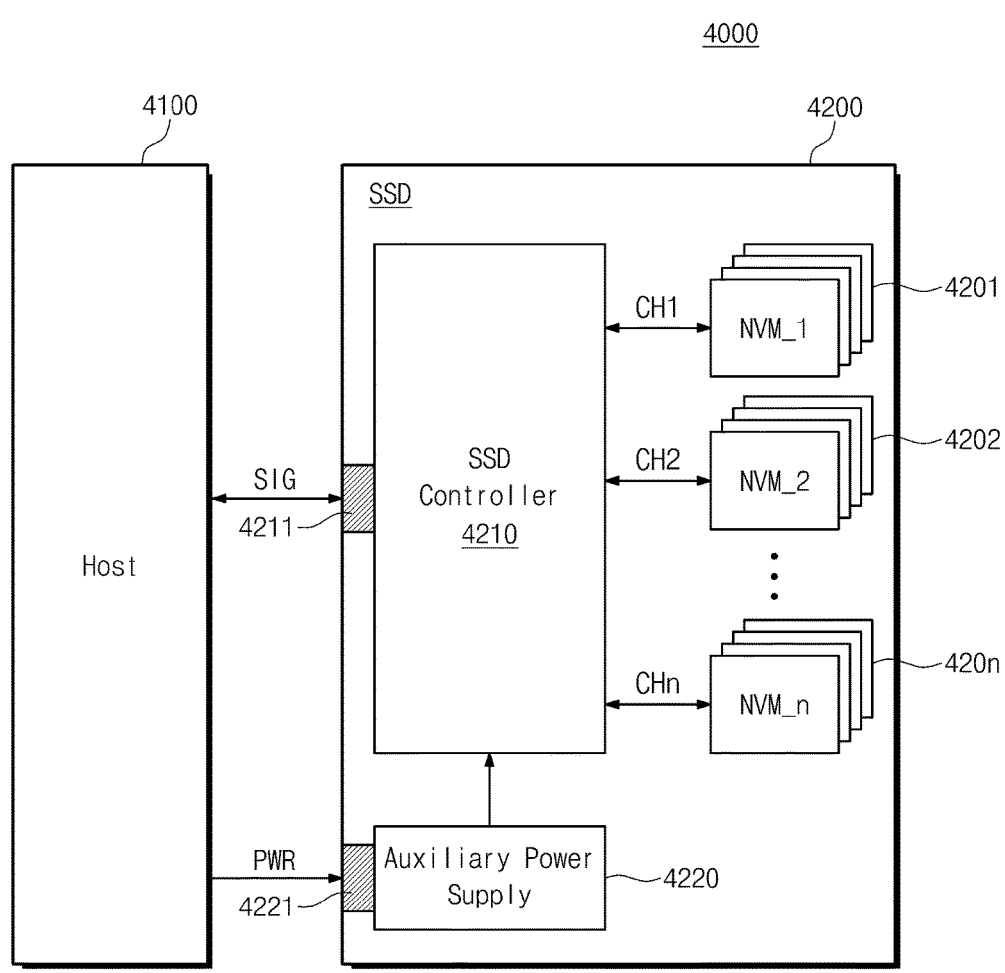
FIG. 17 is a block diagram illustrating an example in which one or more embodiments of the inventive concepts is applied to a solid state drive (SSD)

FIG. 17 is a block diagram illustrating an example of applying a storage device according to example embodiments of the inventive concepts to a solid state drive (SSD). As illustrated, an SSD system 4000 may include a host 4100 and an SSD 4200.

The SSD 4200 exchanges a signal with the host 4100 through a signal connector 4211 and is supplied with power through a power connector 4221. The SSD 4200 may include a plurality of flash memories 4201 to 420n, an SSD controller 4210, and an auxiliary power supply 4220.

The flash memories 4201 to 420n may be used as a storage medium of the SSD 4200. The SSD 4200 may use a flash memory, but a nonvolatile memory device such as PRAM, MRAM, ReRAM and FRAM may be used as the SSD 4200. The flash memories 4201 to 420n may be connected to the SSD controller 4210 through a plurality of channels CH1 to CHn. One or more flash memories may be connected to one channel. Flash memory that may be connected to one channel may be connected to the same data bus. One or more flash memories may be connected to a single channel. Flash memories connected to the single channel may be connected to the same data bus.

The SSD controller 4210 may transfer/receive a signal SIG to/from the host 4100 through the signal connector 4211. The signal SIG may include, for example, a command, an address and data. The SSD controller 4210 may write data into a flash memory or read data from the flash memory. The internal configuration of the SSD controller 4210 will be described below in detail with reference to FIG. 18.

The auxiliary power supply 4220 may be connected to the host 4100 through the power connector 4221. The auxiliary power supply 4220 may be charged by receiving power PWR from the host 4100. The auxiliary power supply 4220 may be disposed inside or outside the SSD 4200. For example, the auxiliary power supply 4220 may be disposed on a mainboard and supply auxiliary power to the SSD 4200.

Figure 18:
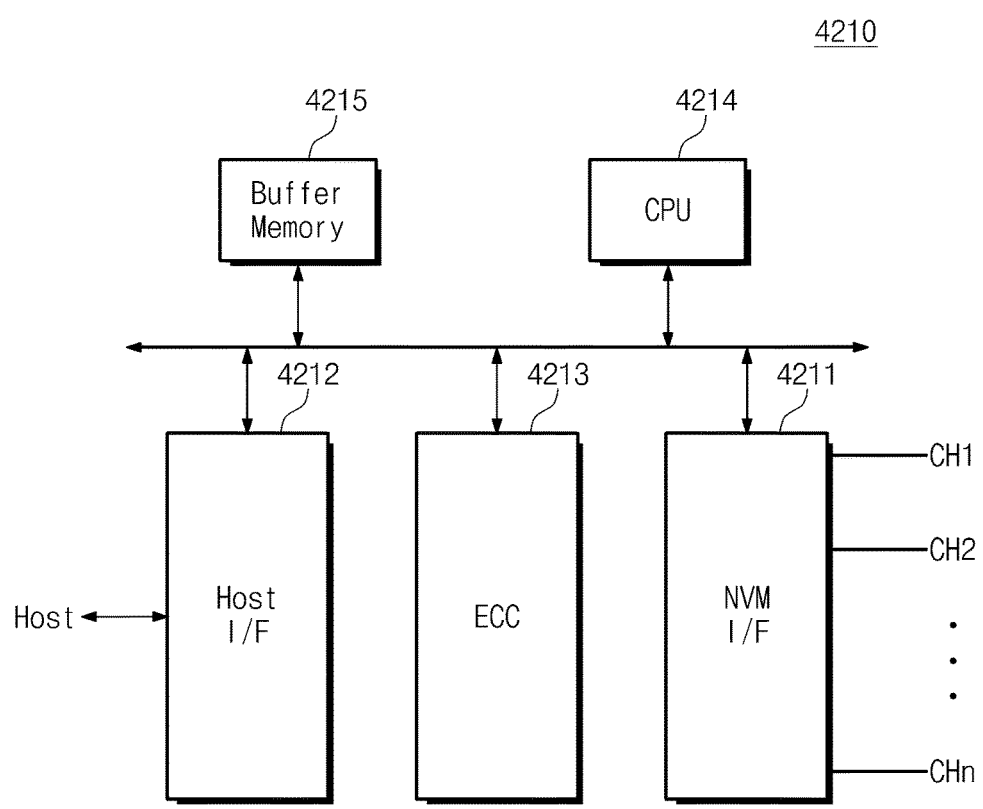
FIG. 18 is a block diagram illustrating an example of the configuration of an SSD controller in FIG. 17.

FIG. 18 is a block diagram illustrating the configuration of the SSD controller 4210 in FIG. 18. As illustrated, the SSD controller 4210 may include a nonvolatile memory interface (NVM interface) 4211, a host interface 4212, an error correction code (ECC) circuit 4213, a central processing unit (CPU) 4214, a buffer memory 4215.

The NVM interface 4211 may scatter data transmitted from the buffer memory 4215 to channels CH1 to CHn. The NVM interface 4211 may transmit data read from flash memories 4201 to 420n (see FIG. 17) the buffer memory 4215. The NVM interface 4211 may use an interface manner of a flash memory. That is, the SSD controller 4210 may perform a program, read or erase operation according to the interface manner of a flash memory.

The host interface 4212 may provide an interface with the SSD 4100 according to the protocol of the host 4212. The host interface 4212 may communicate with the host 4100 through Universal Serial Bus (USB), Small Component Small Interface (SCSI), Peripheral Component Interconnection (PCI) express, Advanced Technology Attachment (ATA), Parallel-ATA (PATA), Serial-ATA (SATA) and/or Serial Attached SCSI (SAS). The host interface 4212 may perform a disk emulation function in order for the host 4100 to recognize the SSD 4200 as a hard disk drive (HDD).

The ECC circuit 4213 may generate an error correction code (ECC) using the data transmitted to the flash memories 4201 to 420n. The generated ECC may be stored in a spare area of the flash memories 4201 to 420n. The ECC circuit 4213 may detect an error of data read from the flash memories 4201 to 420n. If the detected error is within capacitance, the ECC circuit 4213 may correct the detected error.

The CPU 4214 may analyze and process a signal SIG input from a host 4100 (see FIG. 17). The CPU 4213 may control the host 4100 or the flash memories 4201 to 420n through the host interface 4212 or the NVM interface 4211. The CPU 4214 may control the operation of the flash memories 4201 to 420n according to firmware for driving the SSD 4200.

The buffer memory 4215 may temporarily store write data provided from the host 4100 or data read from the flash memory. The buffer memory 4215 may store metadata or cache data to be stored in the flash memories 4201 to 420n. During a sudden power-off operation, the metadata or the cache data stored in the buffer memory 4215 may be stored in the flash memories 4201 to 420n. A DRAM or an SRAM may be included in the buffer memory 4215.

Figure 19:
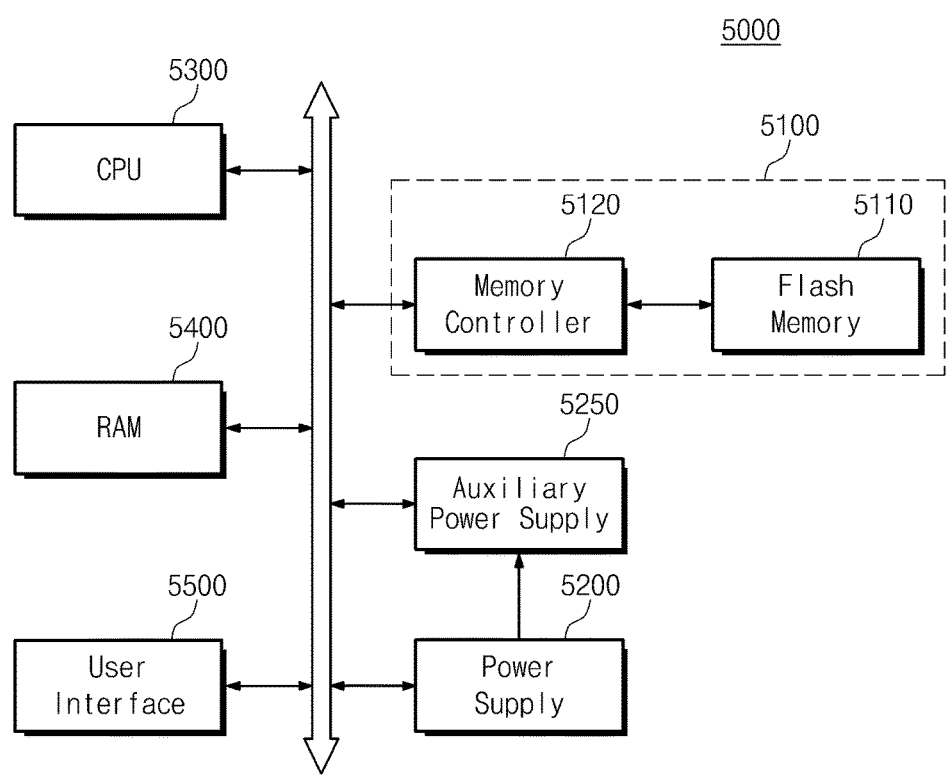
FIG. 19 is a block diagram illustrating an example in which a storage device according to one or more embodiments of the inventive concepts is implemented within an electronic device.

FIG. 19 is a block diagram illustrating an example where a storage device 5000 according to example embodiments of the inventive concepts is implemented with an electronic device. The storage device 5000 may be implemented with a personal computer (PC) or implemented with a handheld electronic device such as a laptop computer, a mobile phone, a personal digital assistant (PDA), and a digital camera.

As illustrated, the electronic device 5000 may include a memory system 5100, a power supply 5200, an auxiliary power supply 5250, a central processing unit (CPU) 5300, a random access memory (RAM) 5400, and a user interface 5500. The memory system 5100 may include a flash memory 5110 and a memory controller 5120.

As described above, a storage device according to example embodiments of the inventive concepts may dynamically manage wear leveling depending on a reuse period. That is, a fast cycle is weighted depending on a reuse period of each memory block to dynamically manage a wear level. Thus, performance of the storage device may be enhanced while maintaining data reliability.

The above-disclosed subject matter is to be considered illustrative, and not restrictive, and the appended claims are intended to cover all such modifications, enhancements, and other features, which fall within the true spirit and scope of the inventive concepts. Thus, to the maximum extent allowed by law, the scope of the inventive concepts is to be determined by the broadest permissible interpretation of the following claims and their equivalents, and shall not be restricted or limited by the foregoing detailed description. While some example embodiments have been particularly shown and described, it will be understood by one of ordinary skill in the art that variations in form and detail may be made therein without departing from the spirit and scope of the claims.

What is claimed is:

1. A method for operating a storage device including a flash memory, comprising:
    determining a reuse period of a selected memory block of the flash memory;
    determining a fast cycle weight according to the reuse period of the selected memory block; and
    managing wear leveling of the selected memory block using the fast cycle weight,
    wherein determining the fast cycle weight comprises
    determining that a fast cycle occurs when the reuse period is less than a first critical value, and
    weighting the fast cycle according to a magnitude of a difference between the reuse period and the first critical value to obtain the fast cycle weight.

2. The method as set forth in claim 1, wherein the reuse period of the selected memory block corresponds to a time interval between a current erase time and a previous erase time of the selected memory block.

3. The method as set forth in claim 1, wherein the reuse period of the selected memory block corresponds to a time interval between a current program time and a previous program time of the selected memory block.

4. The method as set forth in claim 1, further comprising increasing a fast cycle number of the selected memory block by the fast cycle weight for each of successive erase or program operations of the selected memory block, wherein the wear leveling of the selected memory block is managed according to the fast cycle number of the selected memory block.

5. The method as set forth in claim 4, further comprising resetting the fast cycle number of the selected memory block when the reuse period is determined to be greater than a second critical value, the second critical value being greater than the first critical value.

6. The method as set forth in claim 5, further comprising decreasing the fast cycle number when the reuse period is determined to be smaller than the second critical value and greater than a third critical value.

7. The method as set forth in claim 4, further comprising weighting the fast cycle number depending on the reuse period when the fast cycle number increases.

8. A method for operating a storage device including a flash memory, comprising:
   determining a reuse period of a selected memory block of the flash memory;
   determining a fast cycle weight according to the reuse period of the selected memory block; and
   managing wear leveling of the selected memory block using the fast cycle weight,
   wherein the wear leveling of the selected memory block is managed using a sum of fast cycle weights of respective erase or program operations of the selected memory block.

9. The method as set forth in claim 8, wherein a wear leveling operation is performed on the selected memory block when the sum of the fast cycle weights reaches a wear leveling threshold.

10. The method as set forth in claim 8, wherein the sum of the fast cycle weights decreases when the reuse period is determined to be greater than a first reduction threshold and smaller than a second reduction threshold.

11. The method as set forth in claim 10, wherein the sum of the fast cycle weights is reset when the reuse period is determined to be greater than the second reduction threshold.

12. The method as set forth in claim 8, wherein a minimum reuse period among reuse periods of the erase or program operations is applied to determine the sum of the fast cycle weights of the selected memory block.

13. A storage device comprising:
   a flash memory including a plurality of memory blocks; and
   a memory controller configured to determine a fast cycle weight corresponding to a reuse period of a selected memory block among the plurality of memory blocks, and to manage wear leveling of the selected memory block using the fast cycle weight,
   wherein the memory controller manages the wear leveling using a sum of the fast cycle weights.

14. The storage device as set forth in claim 13, wherein the memory controller determines the reuse period of the selected memory block according to a time interval between a current erase operation and a previous erase operation, or a time interval between a current program operation and a previous program operation.

15. The storage device as set forth in claim 14, wherein the memory controller compares a first critical value with the reuse period, and increases a fast cycle number according to the fast cycle weight of the selected memory block when the reuse period is smaller than the first critical value.

16. The storage device as set forth in claim 13, wherein the memory controller performs a wear leveling operation on the selected memory block when the sum of the fast cycle weights reaches a wear leveling threshold.

17. The storage device as set forth in claim 16, wherein the memory controller decreases the sum of the fast cycle weights when the reuse period is greater than a first reduction threshold and smaller than a second reduction threshold.

18. The storage device as set forth in claim 16, wherein the memory controller resets the sum of the fast cycle weights when the reuse period is greater than the second reduction threshold.

* * * * *